United States Patent
Kim

(10) Patent No.: US 9,368,192 B2
(45) Date of Patent: Jun. 14, 2016

(54) SEMICONDUCTOR DEVICE AND METHOD FOR DRIVING THE SAME

(71) Applicant: SK hynix Inc., Gyeonggi-do (KR)

(72) Inventor: Sung-Ho Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/284,972

(22) Filed: May 22, 2014

(65) Prior Publication Data

US 2015/0155026 A1 Jun. 4, 2015

(30) Foreign Application Priority Data

Dec. 4, 2013 (KR) ........................ 10-2013-0149736

(51) Int. Cl.
*G11C 11/4094* (2006.01)
*G11C 11/4091* (2006.01)
*G11C 11/4097* (2006.01)

(52) U.S. Cl.
CPC ........ *G11C 11/4094* (2013.01); *G11C 11/4091* (2013.01); *G11C 11/4097* (2013.01)

(58) Field of Classification Search
None
See application file for complete search history.

(56) References Cited

U.S. PATENT DOCUMENTS

2007/0201291 A1* 8/2007 Cho ....................... G11C 7/065
365/208
2015/0155026 A1* 6/2015 Kim ................... G11C 11/4091
365/191

FOREIGN PATENT DOCUMENTS

KR 1020100030846 3/2010

* cited by examiner

*Primary Examiner* — James G Norman
(74) *Attorney, Agent, or Firm* — IP & T Group LLP

(57) ABSTRACT

A semiconductor device includes a voltage supply unit suitable for providing a first voltage as a source voltage during a standby mode, and a second voltage as the source voltage during an active mode, and a precharge unit suitable for precharging a pair of input/output lines with the source voltage during the standby mode and the active mode.

16 Claims, 4 Drawing Sheets

SEMICONDUCTOR DEVICE AND METHOD FOR DRIVING THE SAME

CROSS-REFERENCE TO RELATED APPLICATIONS

The present application claims priority of Korean Patent Application No, 10-2013-0149736, filed on Dec. 4, 2013, which is incorporated herein by reference in its entirety.

BACKGROUND

1. Field

Exemplary embodiments of the present invention relate to a semiconductor design technology, and more particularly, to a semiconductor memory device and a method for driving the same for performing a precharge operation.

2. Description of the Related Art

In general, a semiconductor device such a dynamic random access memory (DRAM) enters an active mode or a standby mode in response to a command inputted from an external device.

For example, a read operation or a write operation is performed during the active mode. When the read operation is performed, data is read from a memory cell, and when the write operation is performed, data inputted from the external device is written on the memory cell. If the active mode is terminated, the standby mode may be performed. During the standby mode, a data input/output path is precharged with a given voltage level such that data loaded on the input/output path in the active mode is prevented from being maintained. Thus, during a subsequent active mode, a read operation or a write operation will be performed sufficiently.

FIG. 1 is a circuit diagram illustrating a read path of a conventional semiconductor device.

Referring to FIG. 1, a semiconductor 100 includes a voltage supply unit 110, a bit line sense amplifying unit 120, a coupling unit 130, a first precharge unit 140, a second precharge unit 150, a local line driving unit 160 and a local line sense amplifying unit 170.

The voltage supply unit 110 drives a high voltage supply terminal PS and a low voltage supply terminal NS with a bit line precharge voltage VBLP during the standby mode, and drives the high voltage supply terminal PS with a core voltage VCORE and the low voltage supply terminal NS with a ground voltage VSS during the active mode, in response to a first enable signal SAP, a second enable signal SAN and a first precharge signal SADRVPCG.

The voltage supply unit 110 supplies the bit line precharge voltage VBLP as a source voltage and a sink voltage of the bit line sense amplifying unit 120 during the standby mode. The supply voltage unit 110 supplies the core voltage VCORE as the source voltage of the bit line sense amplifying unit 120 and the ground voltage VSS as the sink voltage thereof during the active mode. The bit line precharge voltage VBLP has a voltage level corresponding to a half of the core voltage VCORE.

The bit line sense amplifying unit 120 is coupled between the high voltage supply terminal PS and the low voltage supply terminal NS, and senses and amplifies data loaded on a pair of bit lines BL and BLB during the active mode. More specifically, the bit line sense amplifying unit 120 senses data of a memory cell MC on the pair of bit lines BL and BLB during the active mode, and amplifies the sensed data to a voltage level of the core voltage VCORE and the ground voltage VSS. The bit line sense amplifying unit 120 is disabled by the bit line precharge voltage VBLP provided through the high voltage supply terminal PS and the ground voltage supply terminal NS during the standby mode.

The coupling unit 130 selectively couples the pair of bit lines BL and BLB to a pair of segment lines SIO and SIOB in response to a column selection signal YI. More specifically, the coupling unit 130 transmits the data on the pair of bit lines BL and BLB, which are sensed and amplified by the bit line sense amplifying unit 120 to the pair of segment lines SIO and SIOB in response to the column selection signal VI.

The first precharge unit 140 precharges the pair of segment lines SIO and SIOB with the bit line precharge voltage VBLP in response to a second precharge signal BLEQ during the standby mode. More specifically, the first precharge unit 140 is coupled between the pair of segment lines SIO and SIOB, and precharges the pair of segment lines SIO and SIOB with the bit fine precharge voltage VBLP in response to the second precharge signal BLEQ, which is activated during the standby mode. Meanwhile, since the pair of bit lines BL and BLB are precharged with the bit line precharge voltage VBLP during the standby mode, the pair of segment lines SIO and SIOB are precharged with the bit line precharge voltage VBLP to minimize a leakage current caused by a transistor included in the coupling unit 130.

The second precharge unit 150 precharges the pair of segment lines SIO and SIOB with the core voltage VCORE in response to a third precharge signal SIOPCG during an initial period of the active mode. More specifically, the second precharge unit 150 is coupled between the pair of segment lines SIO and SIOB, and precharges the pair of segment lines SIO and SIOB with the core voltage VCORE in response to the third precharge signal SIOPCG, which is activated during the initial period of the active mode. A voltage level of the pair of segment lines SIO and SIOB is increased from the bit line precharge voltage VBLP to the core voltage VCORE for a sufficient operation of the local line driving unit 160 during the active mode.

The local line driving unit 160 transmits the data on the pair of segment lines SIO and SIOB to a pair of local lines LIO and LIOB in response to a third enable signal LSAEN. The local line driving unit 160 may be provided to overcome a loading concern since pairs of segment lines (not shown) are coupled to the pair of local lines LIO and LIOB.

The local line sense amplifying unit 170 senses and amplifies the data on the pair of local lines LIO and LIOB, and transmits the amplified data to a global line GIO. That is, the local line sense amplifying unit 170 amplifies the data on the pair of local lines LIO and LIOB with a given voltage, and transmits the amplified data to the global line GIO.

Hereinafter, an operation of the conventional semiconductor device shown in FIG. 1 will be described as below.

Firstly, the operation of the standby mode of the convention semiconductor will be described as below.

If the standby mode is performed, the voltage supply unit 110 drives the high voltage supply terminal PS and the low supply terminal NS with the bit line precharge voltage VBLP in response to the first precharge signal SADRVPCG. Thus, the bit line sense amplifying unit 120 is disabled since the high voltage supply terminal, e.g., a source voltage terminal, of the bit line sense amplifying unit 120 has a same voltage level as the low voltage supply terminal, e.g., a sink voltage terminal, of the bit line sense amplifying unit 120. The first precharge unit 140 precharges the pair of segment lines SIO and SIOB with the bit line precharge voltage VBLP in response to the second precharge signal BLEQ. Since the pair of bit lines BL and BLB are precharged with the bit line precharge voltage, the leakage current of the transistor included in the coupling unit 130 may be minimized by precharging the pair of segment lines SIO and SIOB with the bit line precharge voltage VBLP. The second precharge unit 150 is disabled in response to the third precharge signal SIOPCG.

Next, the operation of the active mode of the convention semiconductor device will be described.

If the active mode is performed, the voltage supply unit 110 drives the high voltage supply terminal PS with the core voltage VCORE in response to the first enable signal SAP, and drives the low voltage supply terminal NS with the ground voltage VSS in response to the second enable signal SAN. Thus, the bit line sense amplifying unit 120 senses and amplifies the data on the pair of bit lines BL and BLB. The second precharge unit 150 precharges the pair of segment lines SIO and SIOB with the core voltage VCORE in response to the third precharge signal SIOPCG during the initial period of the active mode. That is, the pair of segment lines SIO and SIOB are precharged with the core voltage VCORE instead of the bit line precharge voltage VBLP for a sufficient operation of the local line driving unit 160 during the active mode. Herein, the first precharge unit 140 is disabled. The coupling unit 130 transmits the data on the pair of bit lines BL and BLB in response to the column selection signal YI. The local line driving unit 160 transmits the data on the pair of segment lines SIO and SIOB to the pair of local lines LIO and LIOB. The local line sense amplifying unit 170 amplifies the data on the pair of local lines LIO and LIOB with a given voltage and transmits the amplified data to the global line GIO.

However, in the aforementioned conventional semiconductor device 100, an off-current may occur in the transistor included in the second precharge unit 150 during the standby mode. The core voltage VCORE is provided to a source of the transistor of the second precharge unit 150, and the bit line precharge voltage VBLP is provided to a drain of the transistor of the second precharge unit 150. Thus, since a current path is formed between a core voltage VCORE terminal and a bit line precharge voltage VBLP terminal of the conventional semiconductor device 100 during the standby mode, a leakage current may occur.

FIG. 2 is a block diagram illustrating an expanded read path of the conventional semiconductor device shown in FIG. 1.

As shown in FIG. 2, the pairs of segment lines SIO<1:M> and SIOB<1:M> are arranged in a plurality of memory cells MAT<1:N> A large amount of leakage current may occur in the conventional semiconductor device 100 by second precharge units coupled to the pairs of segment lines SIO<1:M> and SIOB<1:N> during the standby mode.

SUMMARY

Exemplary embodiments of the present invention are directed to a semiconductor memory device and a method for driving the same, which prevents a leakage current caused by a precharge unit during a standby mode.

In accordance with an exemplary embodiment of the present invention, a semiconductor device may include a voltage supply unit suitable for providing a first voltage as a source voltage during a standby mode, and a second voltage as the source voltage during an active mode, and a precharge unit suitable for precharging a pair of input/output lines with the source voltage during the standby mode and the active mode.

In accordance with another exemplary embodiment of the present invention, a semiconductor device may include a voltage supply unit suitable for providing a first voltage supply terminal and a second voltage supply terminal with a first voltage during a standby mode, and providing the first voltage supply terminal with a second voltage and the second voltage supply terminal with a third voltage during an active mode, in response to a first enable signal, a second enable signal and a first precharge signal, a sense amplifying unit coupled between the first voltage supply terminal and the second voltage supply terminal and suitable for sensing and amplifying data on a pair of first input/output lines during the active mode, a coupling unit suitable for selectively coupling the pair of first input/output lines to a pair of second input/output lines in response to a selection signal, a first precharge unit suitable for coupling the pair of second input/output lines to the first voltage supply terminal during the standby mode in response to a second precharge signal, and a second precharge unit suitable for coupling the pair of second input/output lines to the first voltage supply terminal during a set period of the active mode in response to a third precharge signal.

In accordance with further exemplary embodiment of the present invention, a method for driving a semiconductor device including first and second precharge units, which are commonly coupled to a first voltage supply terminal, may include providing the first voltage supply terminal with a first voltage and precharging a pair of segment lines with the first voltage by the first precharge unit during a standby mode, and providing the first voltage supply terminal with a second voltage and precharging the pair of segment lines with the second voltage by the second precharge unit during a set period of an active mode.

In accordance with further exemplary embodiment of the present invention, a method for driving a semiconductor device may include providing first and second voltages to first and second voltage supply terminals during an active mode, providing a third voltage to the first and second voltage supply terminals during a standby mode, and precharging a pair of input/output lines with a voltage of the first voltage supply terminal during the standby mode and the active mode.

DETAILED DESCRIPTION

Figure 1:
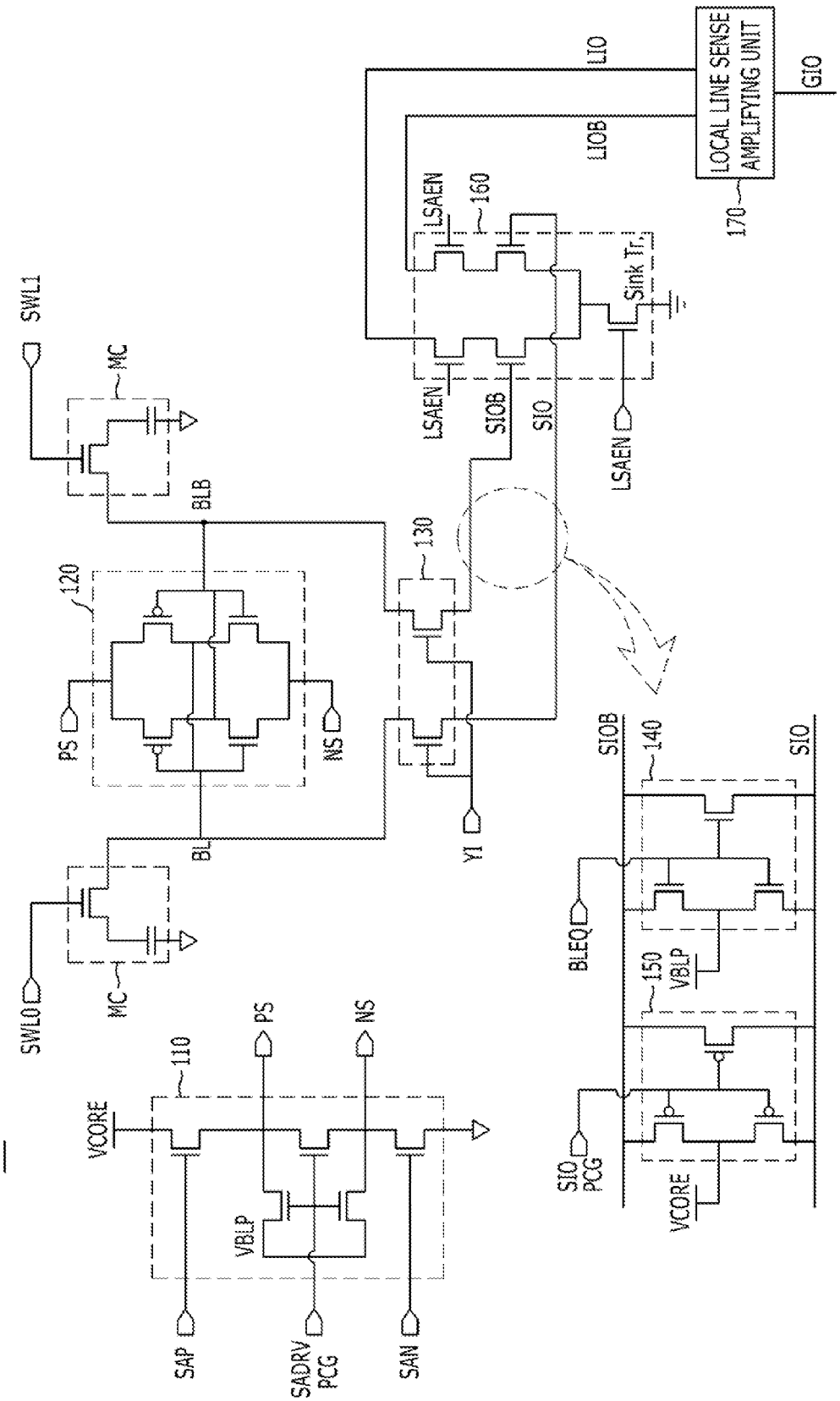
FIG. 1 is a circuit diagram illustrating a read path of a conventional semiconductor device.
Figure 2:
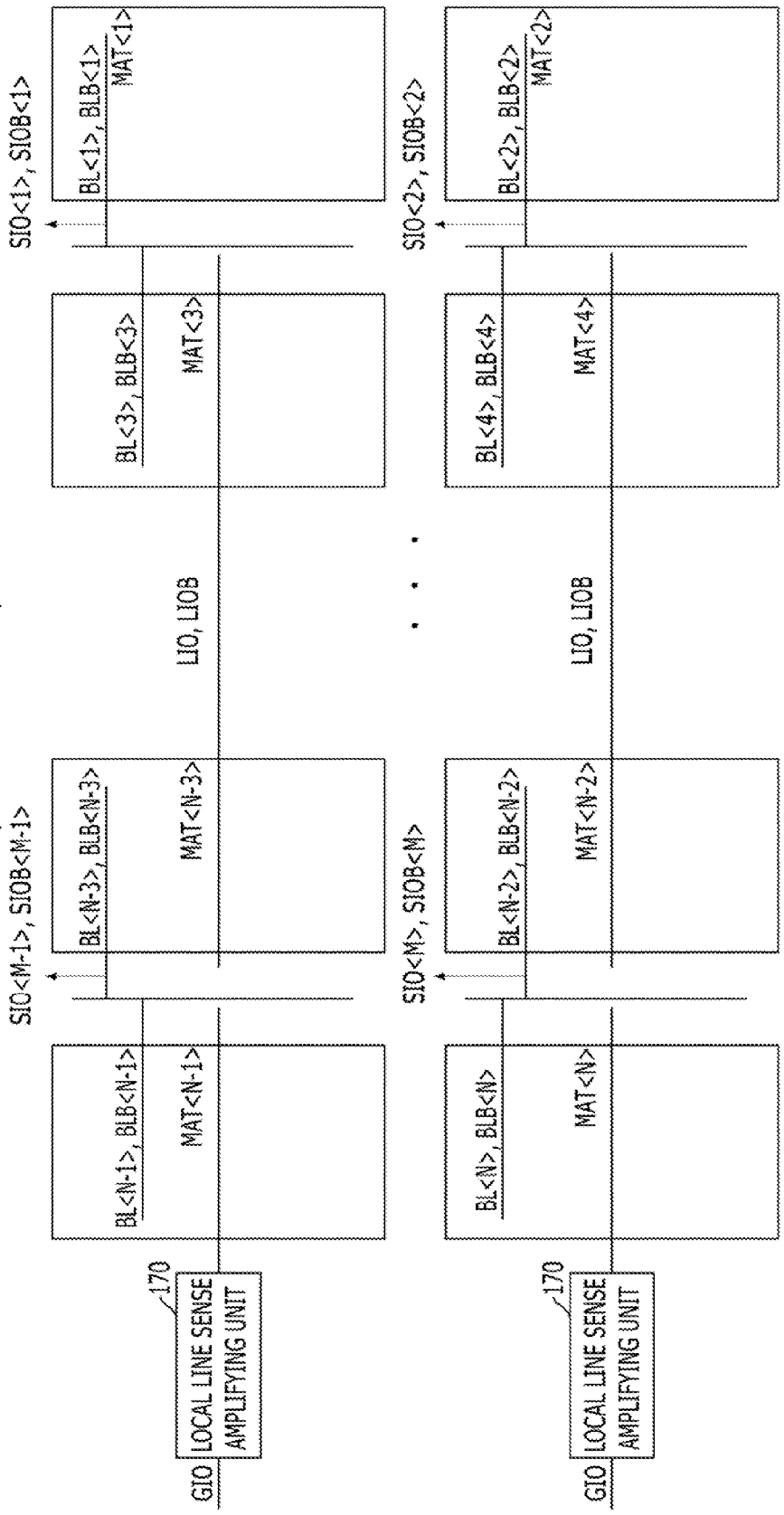
FIG. 2 is a block diagram illustrating an expanded read path of the conventional semiconductor device shown in FIG. 1.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like parts in the various figures and embodiments of the present invention.

The drawings are not necessarily to scale and in some instances, proportions may have been exaggerated in order to clearly illustrate features of the embodiments. In this specification, specific terms have been used. However, the terms are used to describe the present invention, and are not used to qualify the sense or limit the scope of the present invention.

It is also noted that in this specification, 'and/or' represents that one or more of components arranged before and after 'and/or' is included. Furthermore, "connected/coupled" refers to one component not only directly coupling another component but also indirectly coupling another component through an intermediate component. In addition, a singular form may include a plural form as long as it is not specifically mentioned in a sentence. Furthermore, 'include/comprise' or 'including/comprising' used in the specification represents that one or more components, steps, operations, and elements exists or are added.

Figure 3:
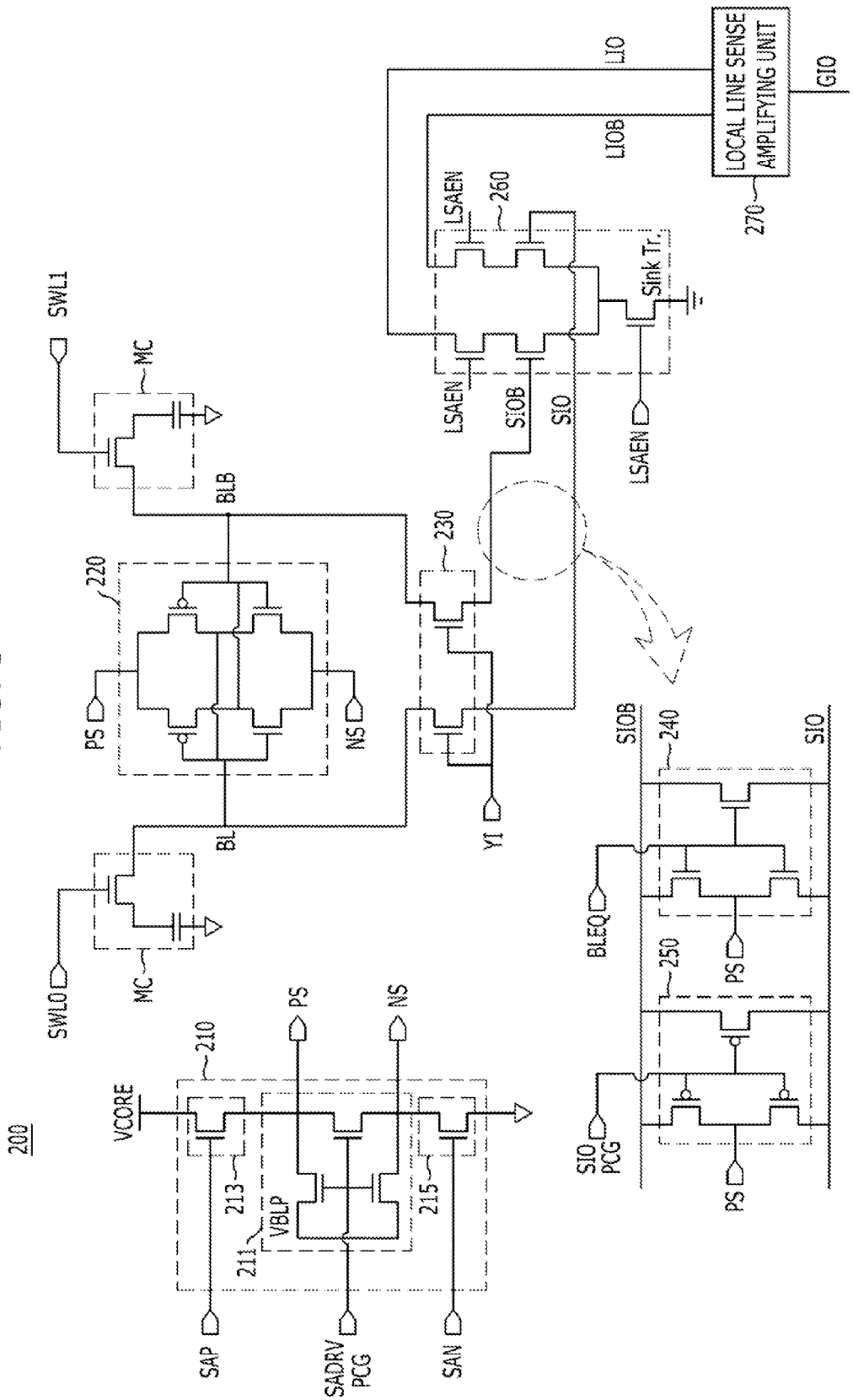
FIG. 3 is a circuit diagram illustrating a semiconductor device in accordance with an exemplary embodiment of the present invention.

FIG. 3 is a circuit diagram illustrating a semiconductor device in accordance with an exemplary embodiment of the present invention.

Referring to FIG. 3, a semiconductor device 200 in accordance with an exemplary embodiment of the present invention includes a voltage supply unit 210, a bit line sense amplifying unit 220, a coupling unit 230, a first precharge unit 240, a second precharge unit 250, a local line driving unit 260, and a local line sense amplifying unit 270.

The voltage supply unit 210 drives a high voltage supply terminal PS and a low voltage supply terminal NS with a bit line precharge voltage VBLP during the standby mode, and drives the high voltage supply terminal PS with a core voltage VCORE and the low voltage supply terminal NS with a ground voltage VSS during the active mode, in response to a first enable signal SAP, a second enable signal SAN, and a first precharge signal SADRVPCG.

The voltage supply unit 210 supplies the bit line precharge voltage VBLP as a source voltage and a sink voltage of the bit line sense amplifying unit 220 during the standby mode. The supply voltage unit 210 supplies the core voltage VCORE as the source voltage of the bit line sense amplifying unit 220 and the ground voltage VSS as the sink voltage thereof during the active mode. The bit line precharge voltage VBLP has a voltage level corresponding to a half of the core voltage VCORE.

The voltage supply unit 210 includes a third precharge unit 211, a pull-up driving unit 213, and a pull-down driving unit 215.

The third precharge unit 211 precharges the high voltage supply terminal PS and the low voltage supply terminal NS with the bit line precharge voltage VBLP in response to the first precharge signal SADRVPCG. The pull-up driving unit 213 drives the high voltage supply terminal PS with the core voltage VCORE in response to the first enable signal SAP. The pull-down driving unit 215 drives the low voltage supply terminal NS with the ground voltage VSS in response to the second enable signal SAN.

The bit line sense amplifying unit 220 is coupled between the high voltage supply terminal PS and the low voltage supply terminal NS, and senses and amplifies data loaded on a pair of bit lines BL and BLB during the active mode. More specifically, the bit line sense amplifying unit 220 senses data of a memory cell MC on the pair of bit lines BL and BLB during the active mode, and amplifies the sensed data to a voltage level of the core voltage VCORE and the ground voltage VSS. The bit line sense amplifying unit 220 is disabled by the bit line precharge voltage VBLP provided through the high voltage supply terminal PS and the ground voltage supply terminal NS during the standby mode.

The coupling unit 230 selectively couples the pair of bit lines BL and BLB to a pair of segment lines SIO and SIOB in response to a column selection signal YI. More specifically, the coupling unit 230 transmits the data on the pair of bit lines BL and BLB, which are sensed and amplified by the bit line sense amplifying unit 220, to the pair of segment lines SIO and SIOB in response to the column selection signal YI.

The first precharge unit 240 couples the pair of segment lines SIO and SIOB to the high voltage supply terminal PS in response to a second precharge signal BLEQ during the standby mode. More specifically, the first precharge unit 240 is coupled between the pair of segment lines SIO and SIOB and precharges the pair of segment lines SIO and SIOB with the bit line precharge voltage VBLP provided through the high voltage supply terminal PS in response to the second precharge signal BLEQ, which is activated during the standby mode. Meanwhile, since the pair of bit lines BL and BLB are precharged with the bit line precharge voltage VBLP during the standby mode the pair of segment lines SIO and SIOB are precharged with the bit line precharge voltage VBLP to minimize a leakage current caused by a transistor included in the coupling unit 230.

The second precharge unit 250 couples the pair of segment lines SIO and SIOB to the high voltage supply terminal PS in response to a third precharge signal SIOPCG during an initial period of the active mode. More specifically, the second precharge unit 250 is coupled between the pair of segment lines SIO and SIOB, and precharges the pair of segment lines SIO and SIOB with the core voltage VCORE provided through the high voltage supply terminal PS in response to the third precharge signal SIOPCG, which is activated during the initial period of the active mode. A voltage level of the pair of segment lines SIO and SIOB is increased from the bit line precharge voltage VBLP to the core voltage VCORE for a sufficient operation of the local line driving unit 260 during the active mode. Especially, the second precharge unit 250 is disabled in response to the third precharge signal SIOPCG during the standby mode. However, during the standby mode, the second precharge unit 250 is coupled to the high voltage supply terminal PS, and provided with the same bit line precharge voltage VBLP as the first precharge unit 240. Thus, a current path may be prevented from being formed between the second precharge unit 250 and the first precharge unit 240.

The local line driving unit 260 transmits the data on the pair of segment lines SIO and SIOB to a pair of local lines LIO and LIOB in response to a third enable signal LSAEN. The local line driving unit 260 may be provided to overcome a loading concern since pairs of segment lines (not shown) are coupled to the pair of local lines LIO and LIOB.

The local line sense amplifying unit 270 senses and amplifies the data on the pair of local lines LIO and LIOB, and transmits the amplified data to a global line GIO. That is, the local line sense amplifying unit 270 amplifies the data on the pair of local lines LIO and LIOB with a given voltage, and transmits the amplified data to the global line GIO.

Hereinafter, an operation of the semiconductor device 200 in accordance with an exemplary embodiment of the present invention will be described with reference to FIG. 4.

Figure 4:
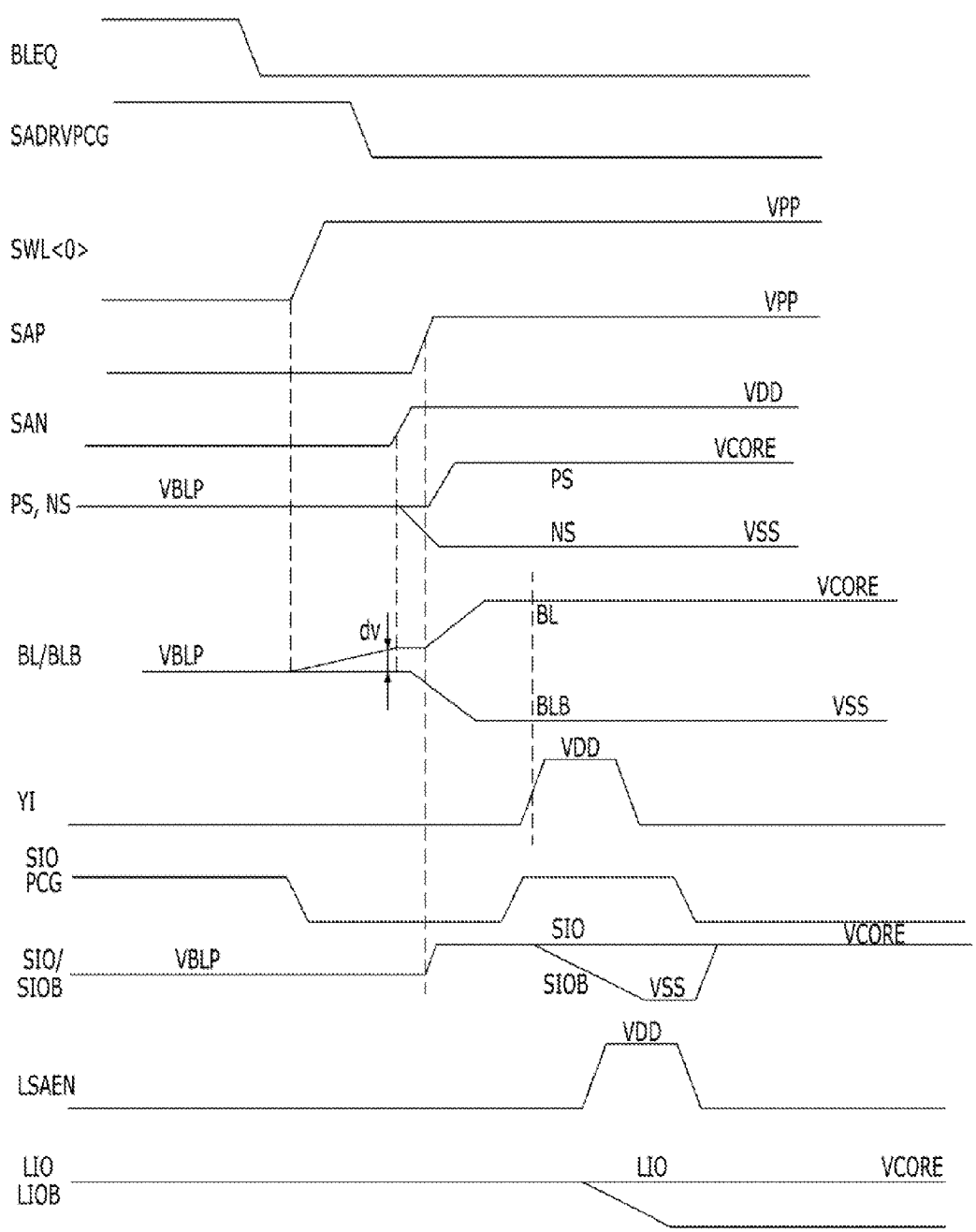
FIG. 4 is a timing diagram illustrating a method for driving a semiconductor device in accordance with an exemplary embodiment of the present invention.

FIG. 4 is a timing diagram illustrating a method for driving a semiconductor device in accordance with an exemplary embodiment of the present invention.

Firstly, the standby mode of the semiconductor device will be described. For example, the standby mode represents that the second precharge signal BLEQ is activated with a logic high level, or all word lines SWL0 and SWL1 are inactivated with a logic low level.

Referring to FIG. 4, the voltage supply unit 210 drives the high voltage supply terminal PS and the low supply terminal NS with the bit line precharge voltage VBLP in response to the first precharge signal SADRVPCG. Thus, the bit line sense amplifying unit 220 is disabled since the high voltage supply terminal, e.g., a source voltage terminal, of the bit line sense amplifying unit 220 has a same voltage level as the low voltage supply terminal, e.g., a sink voltage terminal, of the bit line sense amplifying unit 220. The first precharge unit 240 precharges the pair of segment lines SIO and SIOB with the bit line precharge voltage VBLP in response to the second precharge signal BLEQ. Since the pair of bit lines BL and BLB are precharged with the bit line precharge voltage, the leakage current of the transistor included in the coupling unit 230 may be minimized by precharging the pair of segment lines SIO and SIOB with the bit line precharge voltage VBLP.

Herein, the second precharge unit 250 is disabled in response to the third precharge signal SIOPCG. Especially, the second precharge unit 250 is provided with the same bit line precharge voltage VBLP as the first precharge unit 240 through the high voltage supply terminal PS during the standby mode. Thus, an off-current does not occur in a transistor included in the second precharge unit 250. That is, since the first precharge unit 240 and the second precharge unit 250 are coupled to the high voltage supply terminal PS through which the bit line precharge voltage VBP is provided, a current path of the leakage current is not formed between the first precharge unit 240 and the second precharge unit 250 during the standby mode. The local line driving unit 260 and the local line sense amplifying unit 270 are disabled.

Next, an operation of the active mode of the semiconductor device will be described as below. For example, the active mode represents that the second precharge signal BLEQ is inactivated with a logic low level, or a selected word line SWL0 is activated with a logic high level.

If the selected word line SWL0 is activated with the logic high level, data stored on a selected memory cell MC is loaded on the bit line BL through a charge sharing process. The voltage supply unit 210 drives the high voltage supply terminal PS with the core voltage VCORE in response to the first enable signal SAP, and the low voltage supply terminal NS with the ground voltage VSS in response to the second enable signal SAN. Thus, the bit line sense amplifying unit 220 senses and amplifies the data on the pair of bit lines BL and BLB. The second precharge unit 250 precharges the pair of segment lines SIO and SIOB with the core voltage VCORE in response to the third precharge signal SIOPCG during the initial period of the active mode. That is, the pair of segment lines SIO and SIOB are precharged with the core voltage VCORE instead of the bit line precharge voltage VBLP for a sufficient operation of the local line driving unit 260 during the active mode. Herein, the first precharge unit 240 is disabled. The coupling unit 230 transmits the data on the pair of bit lines BL and BLB to the pair of segment lines SIO and SIOB in response to the column selection signal YI. The local line driving unit 260 transmits the data on the pair of segment lines SIO and SIB to the pair of local lines LIO and LIOB. The local line sense amplifying unit 270 amplifies the data on the pair of local lines LIO and LIOB with a given voltage and transmits the amplified data to the global line GIO.

A semiconductor device in accordance with an exemplary embodiment of the present invention may prevent a leakage current from occurring in a precharge unit for the pair of segment lines during the standby mode.

While the present invention has been described with respect to the specific embodiments, it will be apparent to those skilled in the art that various changes and modifications may be made without departing from the spirit and scope of the invention as defined in the following claims.

What is claimed is:

1. A semiconductor device, comprising:
    a voltage supply unit suitable for providing a first voltage as a source voltage during a standby mode, and a second voltage as the source voltage during an active mode; and
    a precharge unit suitable for precharging a pair of input/output lines with the source voltage during the standby mode and the active mode,
    wherein the precharge unit includes a first precharge unit and a second precharge unit coupled to a terminal of the source voltage in common, and
    wherein the first voltage is commonly provided to the first precharge unit and the second precharge unit through the terminal of the source voltage during the standby mode.

2. The semiconductor device of claim 1, wherein
    the first precharge unit and the second precharge unit precharge the pair of the input/output lines with the source voltage during the standby mode and a set period of the active mode, respectively.

3. The semiconductor device of claim 2, wherein the second precharge unit is provided with the source voltage by the voltage supply unit during the standby mode.

4. The semiconductor device of claim 1, wherein the first voltage includes a bit line precharge voltage, and the second voltage includes a core voltage.

5. The semiconductor device of claim 1, wherein the pair of input/output lines include a pair of segment lines.

6. The semiconductor device of claim 2, wherein the second precharge unit precharges the pair of input/output lines with the source voltage during an initial period of the active mode.

7. A semiconductor device, comprising:
    a voltage supply unit suitable for providing a first voltage supply terminal and a second voltage supply terminal with a first voltage during a standby mode, and providing the first voltage supply terminal with a second voltage and the second voltage supply terminal with a third voltage during an active mode, in response to a first enable signal, a second enable signal, and a first precharge signal;
    a sense amplifying unit coupled between the first voltage supply terminal and the second voltage supply terminal and suitable for sensing and amplifying data on a pair of first input/output lines during the active mode;
    a coupling unit suitable for selectively coupling the pair of first input/output lines to a pair of second input/output lines in response to a selection signal;
    a first precharge unit suitable for coupling the pair of second input/output lines to the first voltage supply terminal during the standby mode in response to a second precharge signal; and
    a second precharge unit suitable for coupling the pair of second input/output lines to the first voltage supply terminal during a set period of the active mode in response to a third precharge signal,
    wherein the first voltage is commonly provided to the first precharge unit and the second precharge unit through the first voltage supply terminal during the standby mode.

8. The semiconductor device of claim 7, wherein the first voltage includes a bit line precharge voltage, the second voltage includes a core voltage, and the third voltage includes a ground voltage.

9. The semiconductor device of claim 7, wherein the pair of first input/output lines include a pair of bit lines, and the pair of second input/output lines include a pair of segment lines.

10. The semiconductor device of claim 7, wherein the second precharge unit couples the pair of second input/output lines to the first voltage supply terminal during an initial period of the active mode.

11. The semiconductor device of claim 7, wherein the voltage supply unit comprises:
   a third precharge unit suitable for precharging the first voltage supply terminal and the second voltage supply terminal with the first voltage in response to the first precharge signal;
   a pull-up driving unit suitable for providing the first voltage supply terminal with the second voltage in response to the first enable signal; and
   a pull-down driving unit suitable for providing the second voltage supply terminal with the third voltage in response to the second enable signal.

12. A method for driving a semiconductor device including first and second precharge units, which are commonly coupled to a first voltage supply terminal, the method comprising:
   providing commonly the first and second precharge units with a first voltage through the first voltage supply terminal and precharging a pair of segment lines with the first voltage by the first precharge unit during a standby mode; and
   providing the first voltage supply terminal with a second voltage and precharging the pair of segment lines with the second voltage by the second precharge unit during a set period of an active mode.

13. The method of claim 12, further comprising:
   providing a second voltage supply terminal with the first voltage during the standby mode; and
   providing the second voltage supply terminal with a third voltage during the active mode.

14. The method of claim 13, wherein a sense amplifying unit is precharged with the first voltage during the standby mode, and the sense amplifying unit senses and amplifies data on a pair of bit lines using the second and third voltages during the active mode.

15. The method of claim 13, wherein the first voltage includes a bit line precharge voltage, the second voltage includes a core voltage, and the third voltage includes a ground voltage.

16. The method of claim 12, wherein the set period includes an initial period of the active mode.

* * * * *